United States Patent
Masuda et al.

(10) Patent No.: US 8,963,017 B2
(45) Date of Patent: Feb. 24, 2015

(54) MULTILAYER BOARD

(75) Inventors: Gentaro Masuda, Obu (JP); Kouji Kondoh, Toyohashi (JP); Kenji Kondoh, Anjo (JP); Hidetada Kajino, Nagoya (JP)

(73) Assignee: DENSO CORPORATION, Kariya (JP)

( * ) Notice: Subject to any disclaimer, the term of this patent is extended or adjusted under 35 U.S.C. 154(b) by 179 days.

(21) Appl. No.: 13/595,060

(22) Filed: Aug. 27, 2012

(65) Prior Publication Data
US 2013/0048345 A1   Feb. 28, 2013

(30) Foreign Application Priority Data

Aug. 31, 2011 (JP) ................................. 2011-189217
Mar. 5, 2012 (JP) ................................. 2012-48300

(51) Int. Cl.
*H05K 1/16* (2006.01)
*H05K 3/46* (2006.01)
(Continued)

(52) U.S. Cl.
CPC .............. *H05K 3/4626* (2013.01); *H05K 1/186* (2013.01); *H05K 2201/0195* (2013.01); *H05K 3/4069* (2013.01); *H05K 2201/09781* (2013.01); *H05K 2203/061* (2013.01)
USPC ........... 174/260; 174/262; 174/255; 174/256; 174/258; 361/761

(58) Field of Classification Search
CPC .......... H05K 1/185; H05K 2201/0195; H05K 3/4614; H05K 2201/09045; H05K 2203/068; H05K 2201/09018; H05K 3/4626; H05K 1/186; H05K 3/4069; H05K 3/4635; H05K 2201/0129; H01L 21/4857; H01L 23/13
See application file for complete search history.

(56) References Cited

U.S. PATENT DOCUMENTS

| | | | |
|---|---|---|---|
| 5,102,718 A * | 4/1992 | Tingerthal et al. ............ | 428/209 |
| 5,848,466 A * | 12/1998 | Viza et al. ...................... | 29/840 |
| 6,370,013 B1 * | 4/2002 | Iino et al. ................... | 361/306.3 |

(Continued)

FOREIGN PATENT DOCUMENTS

| JP | A-2001-223469 | 8/2001 |
|---|---|---|
| JP | A-2005-129727 | 5/2005 |

(Continued)

OTHER PUBLICATIONS

Office Action dated Sep. 1, 2014 issued in corresponding CN patent application No. 201210314472.5 (and English translation).

*Primary Examiner* — Tuan T Dinh
*Assistant Examiner* — Steven T Sawyer
(74) *Attorney, Agent, or Firm* — Posz Law Group, PLC

(57) ABSTRACT

In a multilayer board, a stacked body includes thermoplastic resin films and low-fluidity resin films with conductive patterns, which are alternately stacked. The stacked body and a resin base film are integrated by hot pressing. The base film has a terminal-connecting through hole for receiving an electrode terminal of an electronic component to be connected to a conductive pattern of the low-fluidity resin film disposed at an end of the stacked body. An electronic component mounting section of the stacked body, which is an area corresponding to the electronic component mounted on the base film in a stacking direction, is configured such that a number of the conductive patterns located in a corresponding section that corresponds to the through hole in the stacking direction is greater than a number of the conductive patterns located in a non-corresponding section without corresponding to the through hole in the stacking direction.

4 Claims, 8 Drawing Sheets

(51) Int. Cl.
*H05K 1/18* (2006.01)
*H05K 3/40* (2006.01)

(56) References Cited

U.S. PATENT DOCUMENTS

| | | | | |
|---|---|---|---|---|
| 6,531,022 | B1* | 3/2003 | Tsukahara | 156/256 |
| 2001/0005545 | A1* | 6/2001 | Andou et al. | 428/209 |
| 2002/0192485 | A1* | 12/2002 | Ochi et al. | 428/548 |
| 2004/0231151 | A1* | 11/2004 | Nakatani et al. | 29/830 |
| 2004/0238603 | A1* | 12/2004 | Saito | 228/180.22 |
| 2005/0121772 | A1* | 6/2005 | Hayashi et al. | 257/700 |
| 2007/0272436 | A1* | 11/2007 | Matsui | 174/260 |
| 2009/0020319 | A1 | 1/2009 | Yamada | |
| 2009/0056978 | A1* | 3/2009 | Miura et al. | 174/250 |
| 2011/0061903 | A1* | 3/2011 | Sahara et al. | 174/254 |
| 2011/0266033 | A1 | 11/2011 | Tada et al. | |

FOREIGN PATENT DOCUMENTS

| | | |
|---|---|---|
| JP | A-2011-187843 | 9/2011 |
| JP | A-2011-222553 | 11/2011 |

* cited by examiner

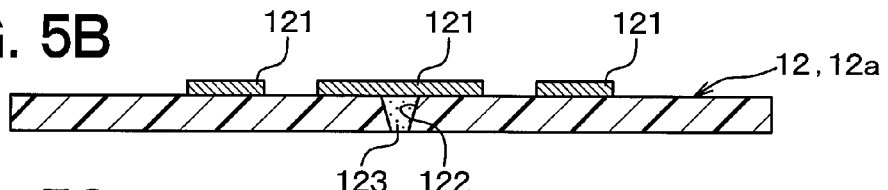
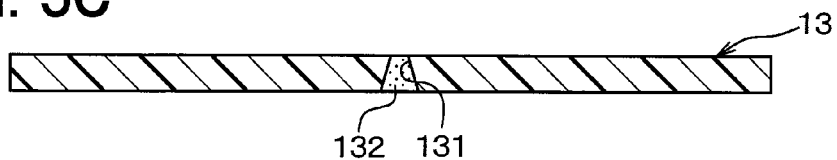
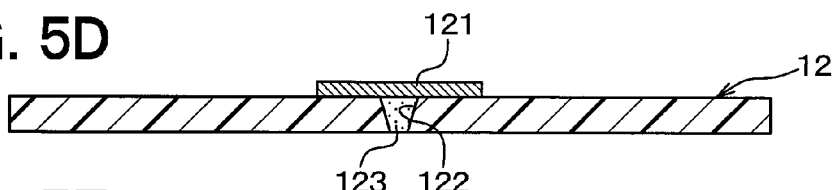
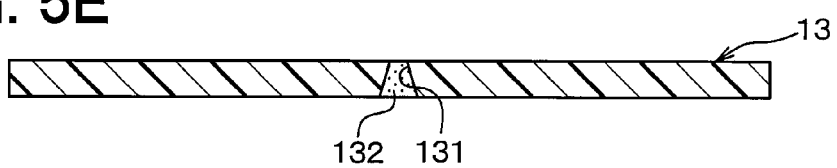
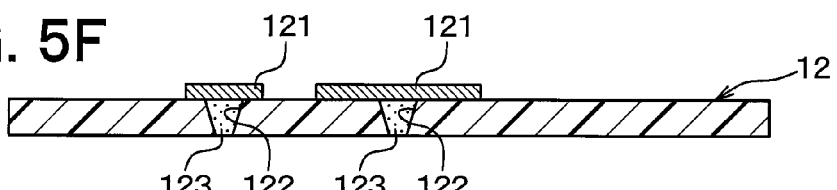
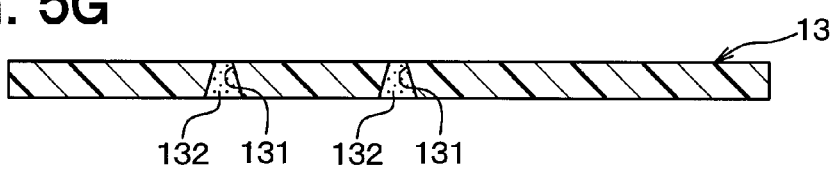
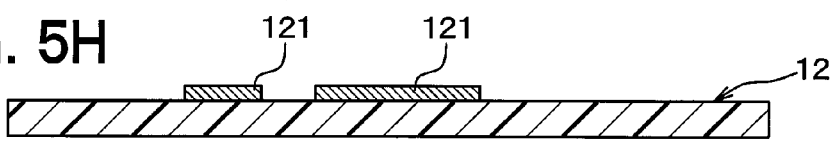

MULTILAYER BOARD

CROSS REFERENCE TO RELATED APPLICATION

This application is based on Japanese Patent Applications No. 2011-189217 filed on Aug. 31, 2011 and No. 2012-48300 filed on Mar. 5, 2012, the disclosures of which are incorporated herein by reference.

TECHNICAL FIELD

The present disclosure relates to a multilayer board including a stacked body of resin films formed by hot pressing.

BACKGROUND

For example, JP2006-203114A, which corresponds to US2009/0020319A1, describes a multilayer board including resin films having conductive patterns on a surface thereof and thermoplastic resin films made of a thermoplastic resin, which is softened with heat. The resin films with the conductive patterns and the thermoplastic resin films are alternately stacked and heat-sealed by hot pressing through a pressing machine or the like.

The multilayer board described in JP2006-203114A has a structure in which the resin film having the conductor pattern on an upper surface thereof is disposed on the resin film having the conductor pattern on a lower surface thereof.

The inventors of the present disclosure are studying to form a multilayer board by performing a hot pressing in a state where a resin base film for receiving an electronic component (e.g., LSI) thereon is stacked on a stacked body. The stacked body includes resin films having conductive patterns on a surface thereof and thermoplastic resin films alternately stacked with the resin films with the conductive patterns. To mount the electronic component on the multilayer board, terminal-connecting through holes are formed in the resin base film to expose the conductive patterns of the resin film disposed at an end layer of the stacked body from the resin base film. Electrode terminals of the electronic component are inserted into the terminal-connecting through holes of the base resin film, and connected to the conductive patterns of the resin film disposed at the end layer of the stacked body.

In such a multilayer board, however, it is difficult to properly connect the electrode terminals of the electronic component to the conductive patterns through the terminal-connecting through holes, resulting in reduction of reliability of connection between the electronic component and the conductive patterns.

SUMMARY

The present disclosure is made in view of the foregoing matter, and it is an object of the present disclosure to provide a multilayer board capable of improving the reliability of connection between an electronic component and a conductive pattern of a stacked body.

The inventors dedicated to studying to achieve the object, and had a finding that flatness of each of resin films of a multilayer board reduces depending on the layout of conductive patterns in the multilayer board. As a result of the reduction of flatness of the resin films, the depth of a terminal-connecting through hole of a resin base film in a stacking direction varies, affecting the connection between an electrode terminal of an electronic component mounted on the resin base film and the conductive pattern.

According to an aspect of the present disclosure, a multilayer board includes a stacked body and a resin base film, which are integrated with each other by hot pressing. The stacked body includes a plurality of low-fluidity resin films and a plurality of thermoplastic resin films, which are alternately stacked so that one of the low-fluidity resin films is located at an end of the stacked body as an end resin film. Each of the low-fluidity resin films has a conductive pattern on at least one surface thereof. The thermoplastic resin films are softened when being heated to a predetermined temperature. The low-fluidity resin films have a fluidity lower than that of the thermoplastic resin films at the predetermined temperature. The resin base film is adjoined to the end resin film for receiving an electronic component thereon. The resin base film has a terminal-connecting through hole for receiving an electrode terminal of the electronic component such that the electronic component is mounted on the resin base film and the electrode terminal of the electronic component is connected to the conductive pattern of the end resin film. The stacked body has an electronic component mounting section provided as a section of the stacked body at a position corresponding to the electronic component with respect to a stacking direction of the stacked body. The electronic component mounting section has a corresponding section that corresponds to the terminal-connecting through hole of the resin base film with respect to the stacking direction, and a non-corresponding section without corresponding to the terminal-connecting through hole of the resin base film. The electronic component mounting section is configured such that a number of the conductive patterns located in the corresponding section with respect to the stacking direction is greater than a number of the conductive patterns located in the non-corresponding section with respect to the stacking direction.

In such a structure, the electronic component mounting section is configured such that the number of the conductive patterns located in the corresponding section with respect to the stacking direction is greater than the number of the conductive patterns located in the non-corresponding section with respect to the stacking direction. Therefore, it is less likely that each of the resin films will be depressed in the corresponding section with respect to the stacking direction during the hot pressing.

As such, it is less likely that the depth of the terminal-connecting through hole will be varied in the stacking direction. Accordingly, the reliability of connection between the electronic component and the conductive pattern improves.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which:

FIGS. 5A through 5H are diagrams illustrating cross-sectional views for explaining a process of forming respective films of a multilayer board as a comparative example to the embodiment;

DETAILED DESCRIPTION

Figure 1:
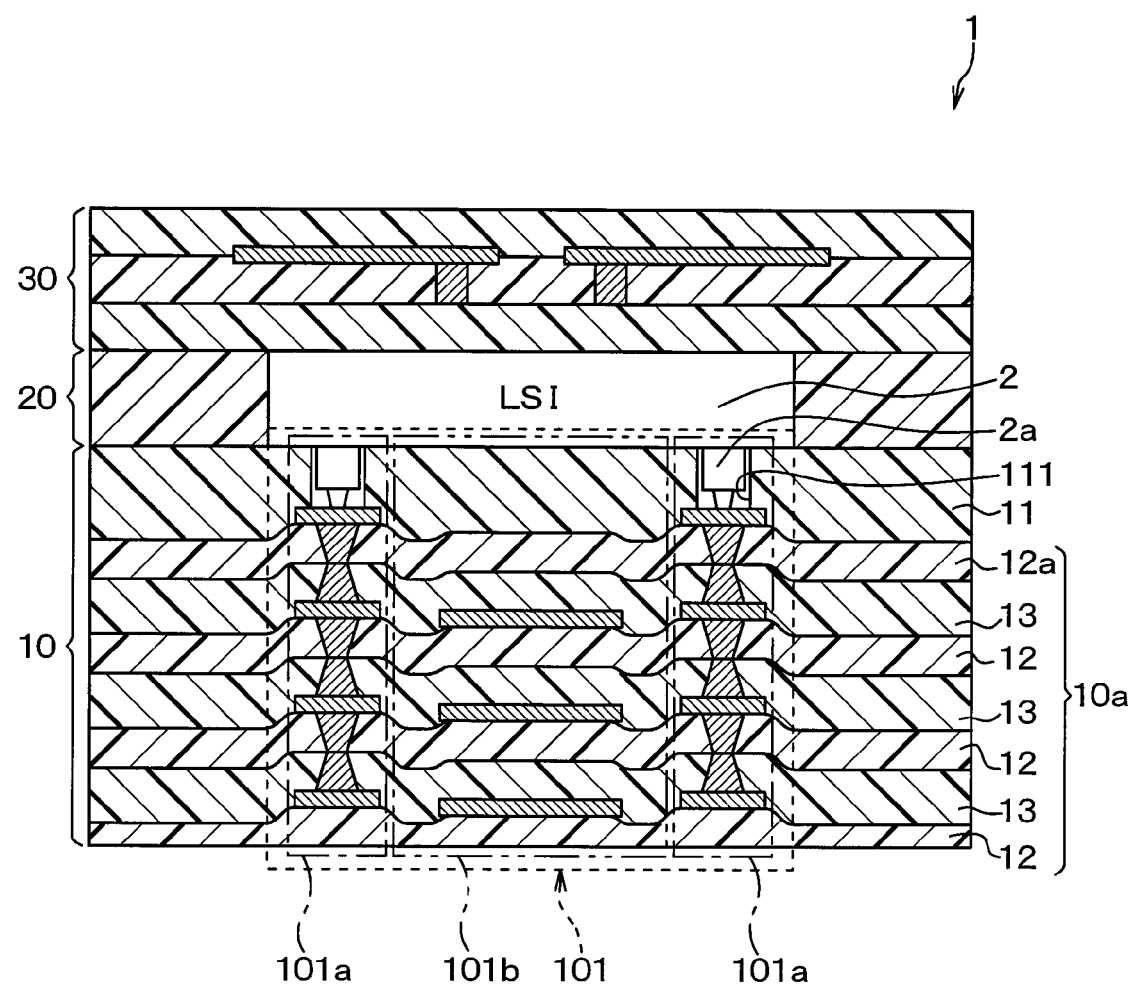
FIG. 1 is a diagram illustrating a cross-sectional view of an electronic component onboard substrate in which an electronic component is mounted on a multiplayer board according to an embodiment of the present disclosure.

An embodiment of the present disclosure will be described with reference to the drawings. FIG. 1 is a diagram illustrating a cross-sectional view of an electronic component onboard substrate 1 in which an electronic component 2 is mounted on a multilayer board 10 according to the present embodiment. In the present embodiment, the electronic component 2 is a large size integration (LSI) chip, for example.

The electronic component onboard substrate 1 generally includes the multilayer board 10 and the electronic component 2 mounted on the multilayer board 10. The multilayer board 10 is formed by hot pressing multiple resin films 12, 13. The electronic component 2 has electrode terminals 2a projecting in a stacking direction of the multilayer board 10. In the present disclosure, the stacking direction corresponds to a direction in which the multiple resin films 12, 13 are sacked. For example, the stacking direction corresponds to an up and down direction in FIG. 1.

The electronic component onboard substrate 1 further includes a protection layer 20 and a heat dissipation layer 30. The protection layer 20 is disposed on a periphery of the electronic component 2 to protect the electronic component 2. The heat dissipation layer 30 serves to dissipate heat generated from the electronic component 2. The heat dissipation layer 30 is provided with a heat sink or the like.

The multilayer board 10 is formed by hot pressing a stacked body 10a and a resin base film 11 disposed on the sacked body 10a in the stacking direction. The resin base film 11 is provided to receive the electronic component 2 thereon.

The stacked body 10a includes first resin films 12 and second resin films 13. The first resin films 12 and the second resin films 13 are alternately stacked in the stacking direction. The first resin films 12 have conductive patterns 121 on one surface (e.g., upper surface) thereof. The second resin films 13 do not have the conductive patterns 121.

In the present embodiment, the stacked body 10a is provided by four first resin films 12 and three second resin films 13, which are alternately stacked. For example, the stacked body 10a is formed by stacking the first resin film 12, the second resin film 13, the first resin film 12, the second resin film 13, the first resin film 12, the second resin film 13 and the first resin film 12 in this order from the base film 11 (i.e., the electronic component 2). Therefore, one of the first resin films 12 is located at an end (e.g., upper end) of the stacked body 10a and is adjoined to the base film 11. Hereinafter, the one of the first resin films 12 adjoined to the base film 11 is also referred to as the end resin film 12a.

Each of the second resin films 13 is provided by a thermoplastic resin film. A film base material of the thermoplastic resin film is made of an additive (mixture) that is provided by adding an inorganic filler to a thermoplastic resin, which is softened when being heated to a predetermined temperature. The thermoplastic resin for forming the second resin films 13 is, for example, a mixed resin of polyetheretherketone resin (PEEK) and polyetherimide resin (PEI).

Each of the first resin films 12 is provided by a low-fluidity resin film. A film base material of the low-fluidity resin film is made of a low-fluidity resin having a lower fluidity than the second resin film 13 at the predetermined temperature. The low-fluidity resin for forming the first resin film 12 is, for example, a thermosetting resin made of a polyimide resin having a thermosetting property.

The base film 11 is provided by a thermoplastic resin film. A film base material of the base film 11 is made of a thermoplastic resin that is softened when being heated to the predetermined temperature. The thermoplastic resin for forming the base film 11 is, for example, a mixed resin of polyetheretherketone resin (PEEK) and polyetherimide resin (PEI).

The base film 11 is formed with terminal-connecting through holes 111 for receiving the electrode terminals 2a of the electronic component 2 to be connected to the conductive patterns 121 of the end resin film 12a. It is to be noted that the thickness of the base film 11 is smaller than a projecting length of the electrode terminals 2a so that the electrode terminals 2a of the electronic component 2a are connected to the conductive patterns 121 of the end resin film 12a through the terminal-connecting through holes 111.

Next, a layout of the conductive patterns 121 inside of the multilayer board 10 will be described. In FIG. 1, a section 101 encompassed by a dashed line denotes an electronic component mounting section 101 of the stacked body 10a, which overlaps with the electronic component 2 when viewed along the stacking direction. Also, a section encompassed by a chain line denotes a corresponding section 101a that overlaps with the terminal-connecting through hole 111 when viewed along the stacking direction. A section encompassed by a double dashed chain line denotes a non-corresponding section 101a that does not overlaps with the terminal-connecting through hole 111 when viewed along the stacking direction.

Namely, the stacked body 10a has the electronic component mounting section 101 provided as a part of the stacked body 10a at a position corresponding to the electronic component 2 with respect to the stacking direction. Further, the electronic component mounting section 101 has the corresponding sections 101a that correspond to the terminal-connecting through holes 111 with respect to the stacking direction, and the non-corresponding section 101b that does not correspond to the terminal-connecting through holes 111 with respect to the stacking direction.

The electronic component mounting section 101 is configured such that the number of the conductive patterns 121 located in the corresponding section 101a with respect to the stacking direction is greater than the number of the conductive patterns 121 located in the non-corresponding section 101b with respect to the stacking direction.

For example, each of the first resin films 12 has the conductive pattern 121 in the corresponding section 101a. In this case, a part of or some of the conductive patterns 121 formed in the corresponding section 101a of the first resin films 12 may be provided as a dummy pattern that is not electrically connected to the electrode terminals 2a of the electronic component 2.

With regard to the end resin film 12a, the conductive pattern 121 is formed only in the corresponding sections 101a that corresponds to the terminal-connecting through holes 111 with respect to the stacking direction. Namely, in the end resin film 12a, the conductive pattern 121 is not formed in the non-corresponding section 101b that does not correspond to the terminal-connecting through holes 111 with respect to the stacking direction.

Figure 2A:
FIGS. 2A through 2H are diagrams illustrating cross-sectional views for explaining a process of forming respective films of the multilayer board according to the embodiment.
Figure 2B:
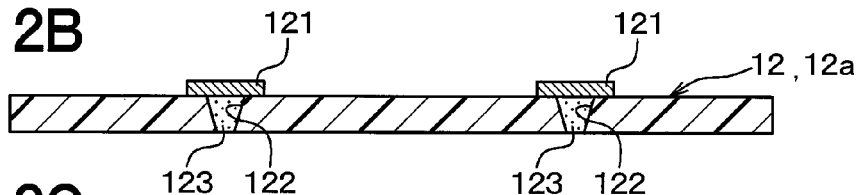
Figure 2C:
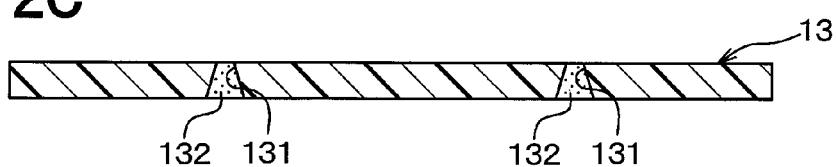
Figure 2D:
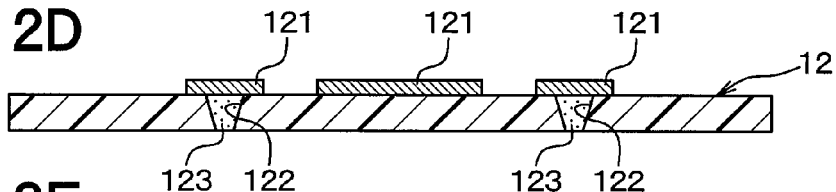
Figure 2E:
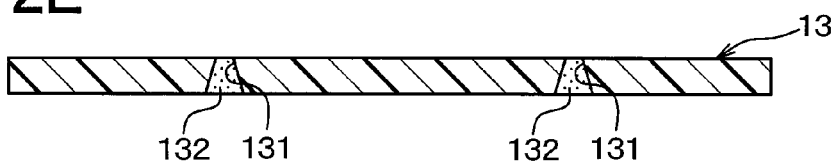
Figure 2F:
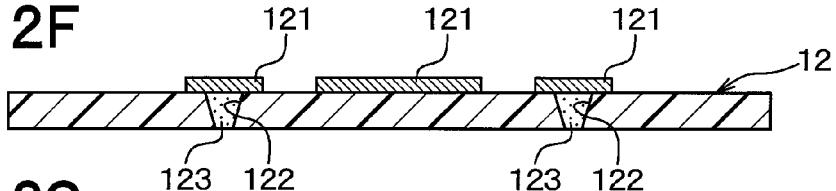
Figure 2G:
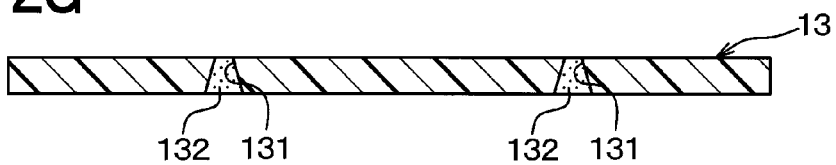
Figure 2H:
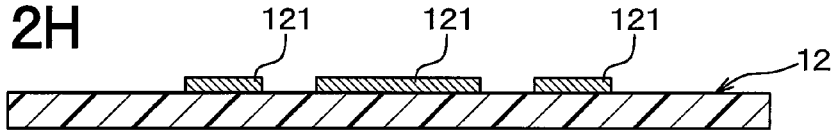
Figure 3A:
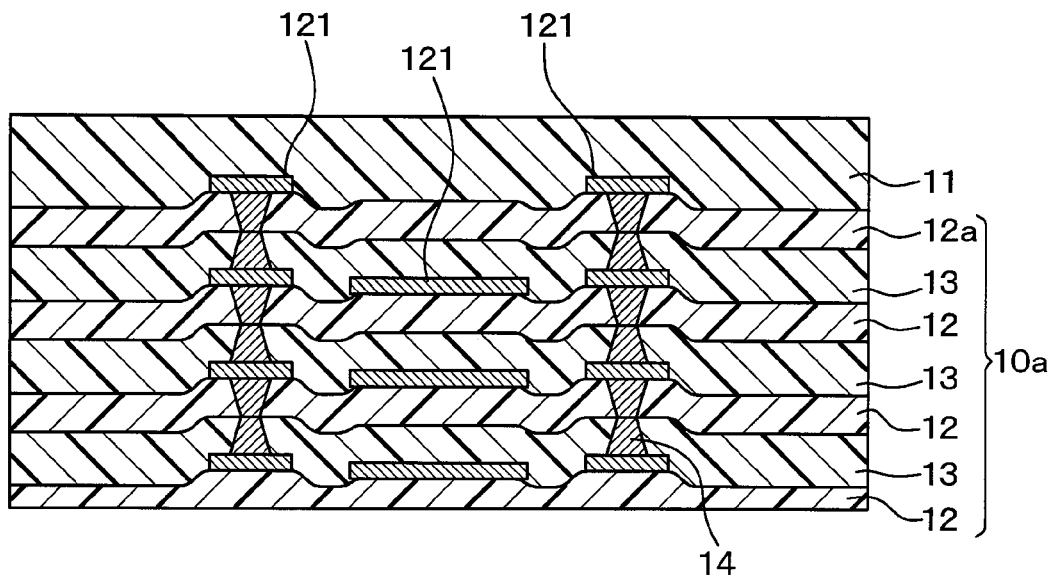
FIGS. 3A and 3B are diagrams illustrating cross-sectional views for explaining a process of manufacturing the multilayer board according to the embodiment.
Figure 3B:
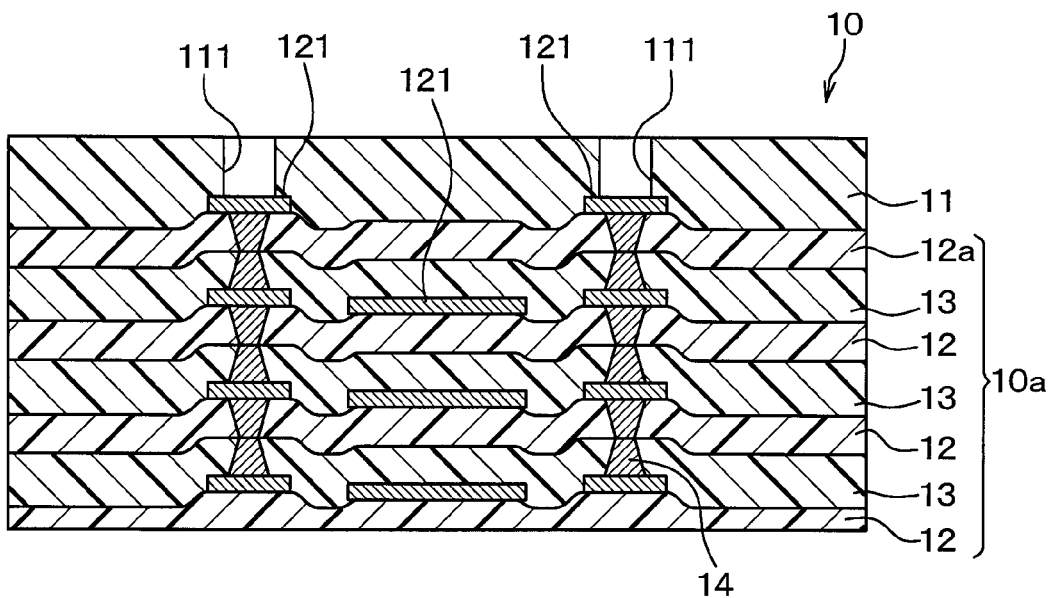
Figure 4A:
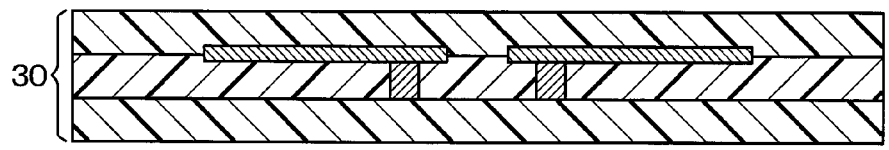
FIGS. 4A through 4D are diagrams illustrating cross-sectional views for explaining a process of manufacturing the electronic component onboard substrate according to the embodiment.
Figure 4B:
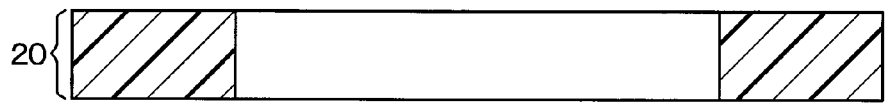
Figure 4C:
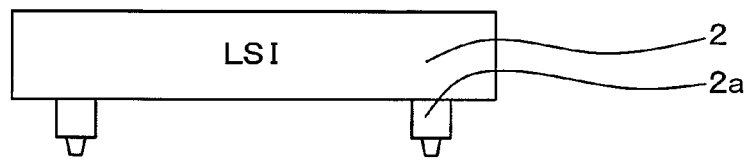
Figure 4D:
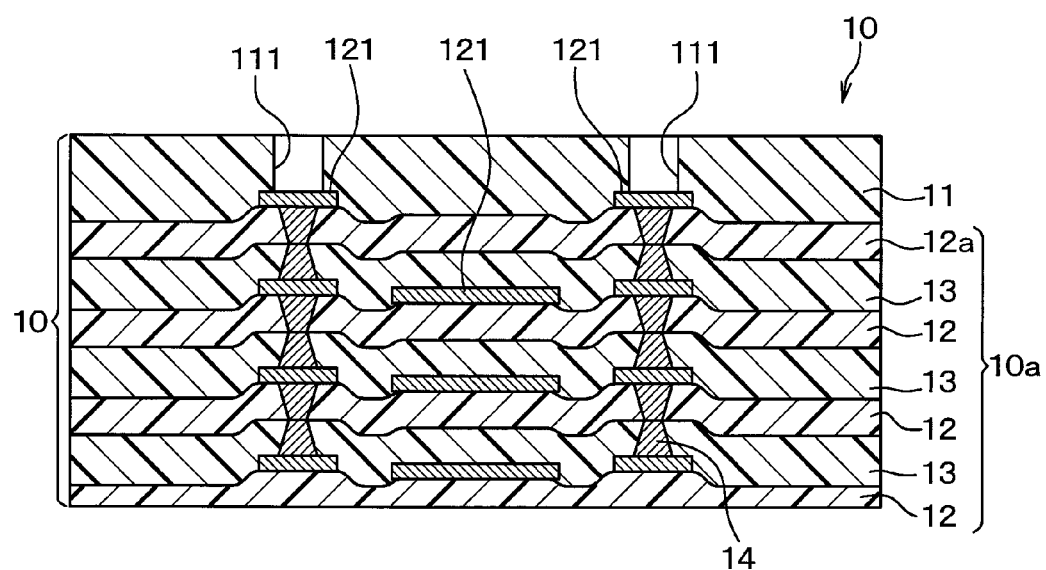

Next, a manufacturing process of the electronic component onboard substrate 1 will be described with reference to FIGS. 2A through 2H, 3A, 3B, and 4A through 4D. FIGS. 2A through 2H are diagrams illustrating cross-sectional views of the respective films 11, 12, 13 for explaining a process of forming each of the films 11, 12, 13. FIGS. 3A and 3B are diagrams illustrating cross-sectional views of the multilayer board 10 for explaining a process of manufacturing the multilayer board 10.

First, as shown in FIGS. 2A through 2H, film base materials (insulative base materials) for the base film 11, the first resin films 12 as the low-fluidity resin films, and the second films 13 as the thermoplastic resin films are prepared.

Then, copper foils are bonded to upper surfaces of the film base materials of the first resin films 12, and edged to form predetermined conductive patterns 121, as shown in FIGS. 2B, 2D, 2F and 2H. In this case, as shown in FIG. 1, the conductive patterns 121 are formed so that the number of the conductive patterns 121 located in the corresponding section 101a with respect to the stacking direction is greater than the number of the conductive patterns 121 located in the non-corresponding section 101b with respect to the stacking direction.

Also, via holes 122 are formed at predetermined positions of the film base materials of the first resin films 12 where the conductive patterns 121 are formed by laser drilling or the like. Further, a conductive paste 123 is filled in the via holes 122 by using a screen printing machine or the like. Therefore, the first resin films 12 shown in FIGS. 2B, 2D, 2F and 2H are formed.

With regard to the second resin films 13, via holes 131 are formed at predetermined positions of the film base materials of the second resin films 13 by laser drilling or the like. The via holes 131 penetrates the film base materials of the second resin films 13 in a thickness direction, which corresponds to the stacking direction. Then, a conductive paste 132 is filled in the via holes 131 by using a screen printing machine of the like. Therefore, the second resin films 13 shown in FIGS. 2C, 2E and 2G are formed.

The conductive pastes 123, 132 are made of metal particles, such as metal particles including tin particles and silver particles, a solvent for adjusting a viscosity, and the like. When the resin films 12, 13 are subjected to the hot pressing, which will be described later, the conductive pastes 123, 132 become electric conducting portions 14 that electrically connect the layers of the stacked body 10a because the metal particles are sintered. In this case, the solvent is vaporized.

The resin films 12, 13 formed in the manners described above are stacked in an order shown in FIGS. 2B through 2H to form the stacked body 10a, and the base film 11 is stacked on the stacked body 10a (stacking process). In this case, the base film 11 is disposed to be adjoined to the end resin film 12a.

Then, the stacked body 10a and the base film 11 stacked on the stacked body 10a are held in a pressing machine (not shown) and the hot pressing is performed (hot pressing step). Namely, a predetermined pressing force is applied to the stacked body 10a and the base film 11 at a predetermined temperature for a predetermined reference time. For example, the predetermined pressing force is 3 to 5 MPa (e.g., approximately 4 MPa), the predetermined temperature is 320 degrees Celsius, and the predetermined reference time is approximately three hours. By the hot pressing, the stacked body 10a and the base film 11 are integrated with each other, as shown in FIG. 3A.

After the hot pressing, the terminal-connecting through holes 111 are formed in the base film 11 by laser drilling or the like so as to expose the conductor patters 121 of the end resin film 12a to the exterior of the multilayer board 10. In this way, the multilayer board 10 shown in FIG. 3B is produced.

In the hot pressing described above, the base film 11 and the second resin films 13, whose film base materials are made of the thermoplastic resins, are softened. Therefore, the base film 11, the first resin film 12 and the second resin films 13 are bonded with one another. Further, the conductive pastes 123, 132 filled in the via holes 122, 131 are sintered. Therefore, the electric conducting portions 14 for electrically connecting between the layers are formed.

Next, a process of manufacturing the electronic component onboard substrate 1 will be described with reference to FIGS. 4A through 4D.

The heat dissipation layer 30, the protection layer 20, the electronic component 2 and the multilayer board 10 are laid on top of the other in the order shown in FIGS. 4A through 4D, and are integrated with one another. Therefore, the electronic component onboard substrate 1 shown in FIG. 1 is produced. In this case, the electrode terminals 2a of the electronic component 2 are inserted in the terminal-connecting through holes 111 of the base film 11. Therefore, the electrode terminals 2a of the electronic component 2 and the conductive patterns 121 of the end resin film 12a are connected to each other.

In the multilayer board 10 of the present embodiment, the conductive patterns 121 are arranged so that the number of the conductive patterns 121 located in the corresponding section 101a with respect to the stacking direction is greater than the number of the conductive patterns 121 located in the non-corresponding section 101b with respect to the stacking direction.

As a comparative example, the layout of the conductive patterns 121 located in the multilayer board 10 can be modified as a multilayer board 100 shown in FIGS. 5A through 5H, 6A, 6B, 7A and 7B.

Figure 6A:
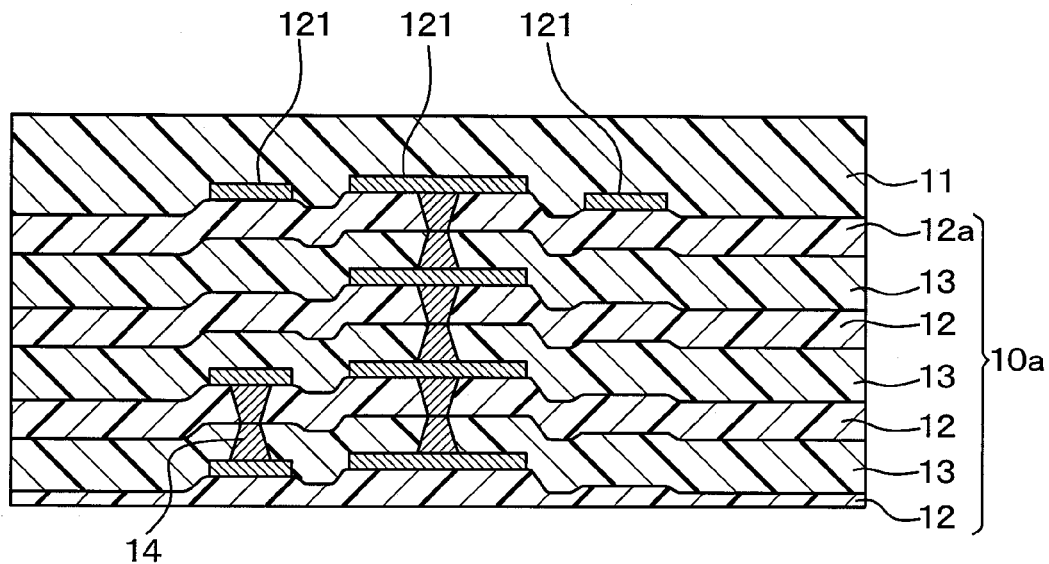
FIGS. 6A and 6B are diagrams illustrating cross-sectional views for explaining a process of manufacturing the multilayer board as the comparative example.
Figure 6B:
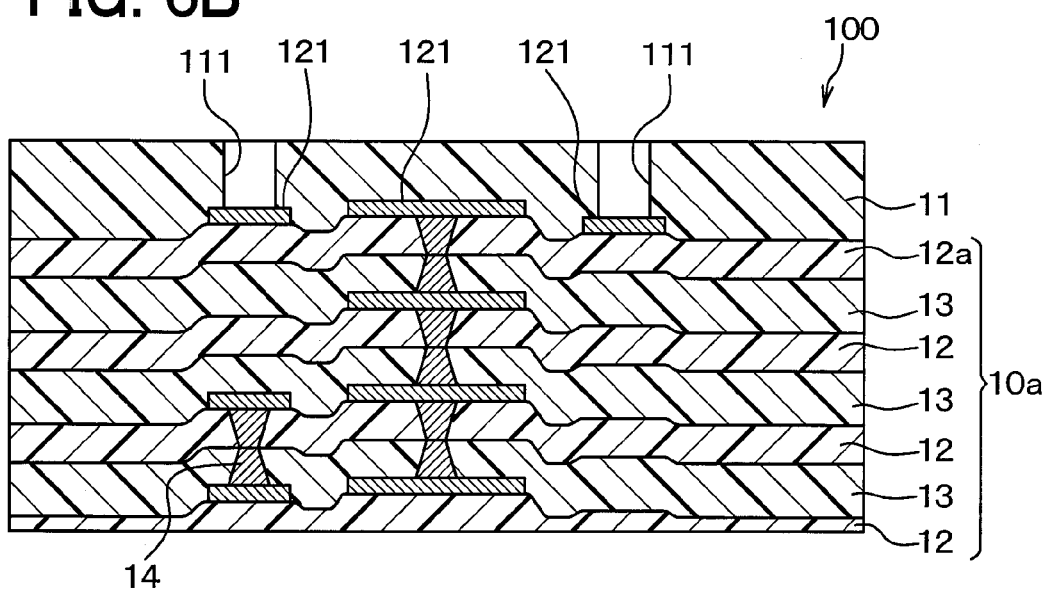
Figure 7A:
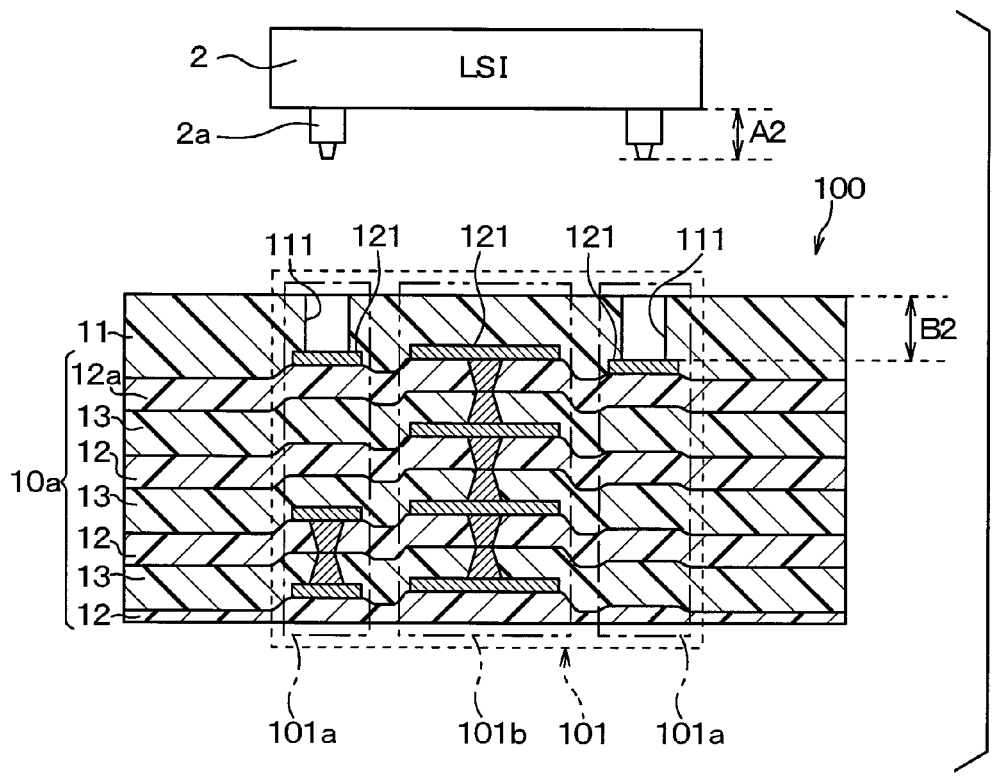
FIGS. 7A and 7B are diagrams illustrating cross-sectional views for explaining a connection state of electrode terminals of an electronic component and conductive patterns of the multilayer board as the comparative example.
Figure 7B:
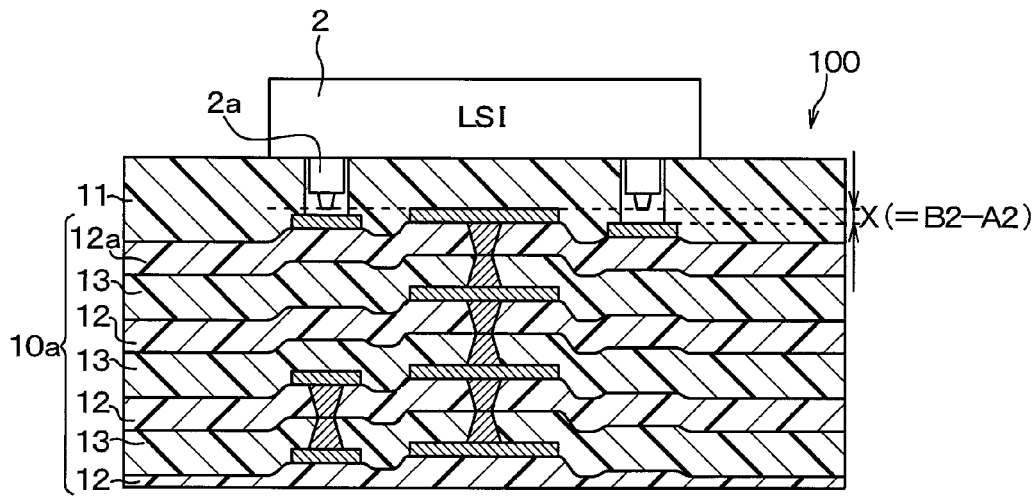

FIGS. 5A through 5H are diagrams illustrating cross-sectional views of resin films of the multilayer board 100 as the comparative example for explaining process of forming the resin films. FIGS. 6A and 6B are diagrams illustrating cross-sectional views of the multilayer board 100 for explaining the manufacturing process thereof. FIGS. 7A and 7B are diagrams illustrating cross-sectional views of the multilayer board 100 for explaining a state of connection between the electrode terminals 2a of the electronic component 2 and the conductive patterns 121. In the multilayer board 100, components similar to or equivalent to the components of the multilayer board 10 of the embodiment will be designated with like reference numbers, and a description thereof will not be repeated.

Firstly, film base materials (insulative base materials) for a base film 11, first resin films 12 as the low-fluidity resin films, and second films 13 as the thermoplastic resin films are prepared, as shown in FIGS. 5A through 5H.

Next, conductive patterns 121 are formed on upper surfaces of the film base materials of the first resin films 12. In this case, as shown in FIGS. 5B, 5D, 5F and 5H, the conductive patterns 121 are formed so that the number of the conductive patterns 121 in the non-corresponding section 101b is greater than the number of conductive patterns 121 in the corresponding section 101a.

Further, via holes 122, 131 are formed in the film base materials of the resin films 12, 13, and conductive pastes 123, 132 are filled in the via holes 122, 131.

The resin films 12, 13 formed in the above manner are laid on top of the other in the order shown in FIGS. 5B through 5H to form a stacked body 10a, and the base film 11 is stacked on the stacked body 10a. Then, the stacked body 10a on which the base film 11 is stacked is subjected to the hot pressing. Thus, the stacked body 10a and the base film 11 are integrated with each other, as shown in FIG. 6A.

After the hot pressing, terminal-connecting through holes 111 are formed in the base film 11 by laser drilling or the like to expose the conductor patters 121 of the end resin film 12a to the exterior of the multilayer board 100. In this way, the multilayer board 100 shown in FIG. 6B is produced.

In the multilayer board 100 produced in the above described manner, at the electronic component mounting section 101, the number of the conductive patterns 121 located in the non-corresponding section 101b with respect to the stacking direction is greater than the number of the conductive patterns 121 located in the corresponding section 101a with respect to the stacking direction. Therefore, flatness of each resin films 12, 13 is reduced. As a result, in each of the resin films 12, 13, a portion corresponding to the corresponding section 101a is depressed in the stacking direction during the hot pressing. If the portions of the resin films 12, 13 corresponding to the corresponding section 101a are depressed, the position of the conductive pattern 121 formed on the end resin film 12a is displaced from an expected position in the stacking direction. As a result, a dimension of the terminal-connecting through holes 111 in the stacking direction, that is, the depth of the terminal-connecting through hole 111 becomes uneven.

For example, as shown in FIGS. 7A and 7B, when the depth B2 of the terminal-connecting through hole 111 is greater than a projecting length A2 of the electrode terminal 2a of the electronic component 2 in the stacking direction (B2>A2), there is a possibility that a clearance X is generated between the conductive pattern 121 of the end resin film 12a and the end of the electrode terminal 2a, resulting in improper connection between the conductive pattern 121 and the electrode terminal 2a.

In the multilayer board 10 of the present embodiment, on the other hand, the conductive patterns 121 are formed so that the number of the conductive patterns 121 located in the corresponding section 101a with respect to the stacking direction is greater than the number of the conductive patterns 121 located in the non-corresponding section 101b with respect to the stacking direction. This arrangement restricts the portions of the resin films 12, 13 corresponding to the corresponding section 101a from being depressed in the stacking direction during the hot pressing.

As such, it is less likely that the position of the conductive pattern 121 formed on the end resin film 12a will be displaced in the stacking direction in the multilayer board 10. Therefore, the deviation of the depth of the terminal-connecting through hole 111 is reduced, and hence the reliability of connection between the conductive pattern 121 and the electronic component 2 improves.

Figure 8A:
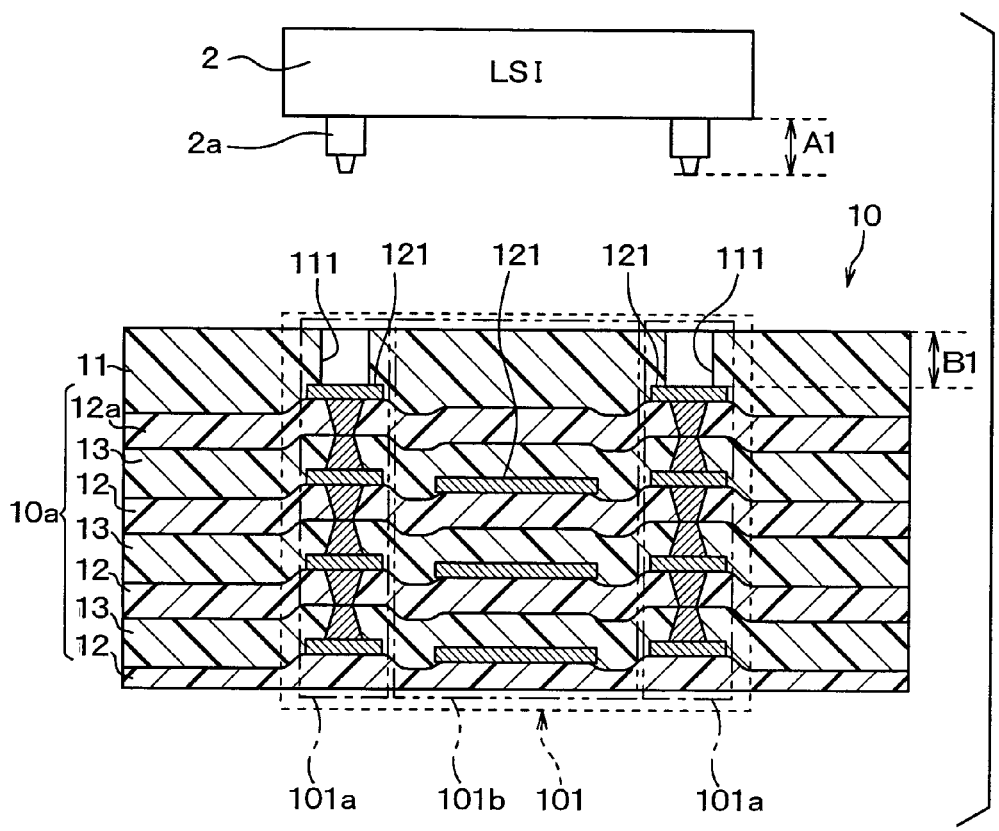
FIGS. 8A and 8B are diagrams illustrating cross-sectional views for explaining a connection state of electrode terminals of the electronic component and conductive patterns of the multilayer board according to the embodiment.
Figure 8B:
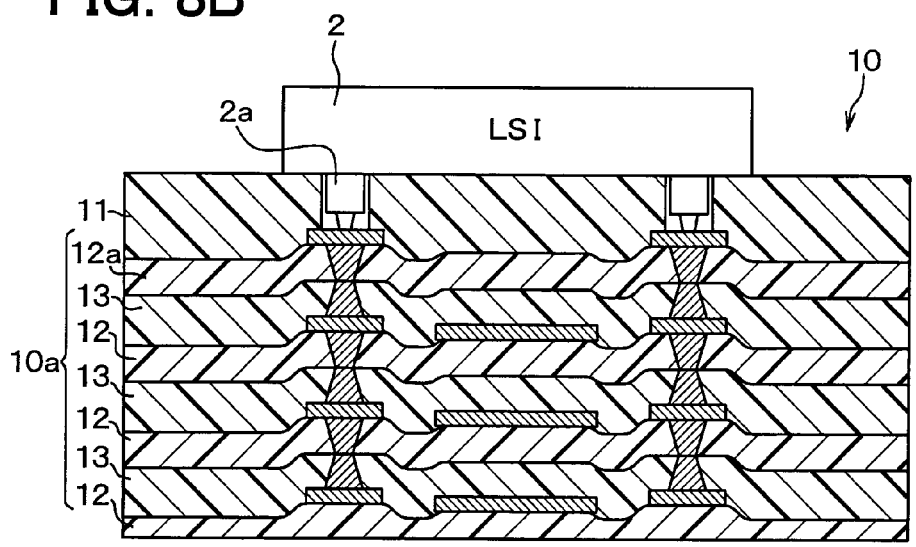

For example, as shown in FIG. 8A, the depth B1 of the terminal-connecting through hole 11 is maintained smaller than a projecting length A1 of the electrode terminal 2a of the electronic component 2 in the stacking direction. Therefore, as shown in FIG. 8B, the conductive pattern 121 of the end resin film 12a and the end of the electrode terminal 2a of the electronic component 2 can be properly connected to each other.

In the multilayer board 10 of the present embodiment, each of the first resin films 12, which are the low-fluidity resin films, has the conductive pattern 121 at the portion corresponding to the corresponding section 101a.

Therefore, during the hot pressing, the displacement of the conductive patterns 121 in the corresponding section 101a can be effectively restricted. As such, the reliability of connection between the electronic component 2 and the conductive pattern 121 improves.

In a case where the end resin film 12a, which is located closest to the electronic component 2 of the first resin films 12, has the conductive pattern 121 in the non-corresponding section 101a, as shown in FIGS. 7A and 7B, there is a possibility that a portion of the end resin film 12a corresponding to the non-corresponding section 101b is deformed toward the electronic component 2. Such deformation of the end resin film 12a is likely to affect the reliability of the connection between the electronic component and the conductive patterns 121.

In the multilayer board 10 of the present embodiment, therefore, the end resin film 12a has the conductive patterns 121 only in the corresponding sections 101a.

Accordingly, it is less likely that the portion of the end resin film 12a corresponding to the non-corresponding section 101 will be deformed toward the electronic component 2, as shown in FIG. 8.

Therefore, the reliability of connection between the electronic component 2 and the conductive patterns 121 improves.

In each of the drawings used for explaining the embodiment described above, the electric conducting portions 141 are exemplarily formed in the corresponding section 101a of the resin films 12, 13 for electrically connecting the conductive patterns 121. However, the positions of the electric conducting portions 141 are not limited to the corresponding section 101a. The electric conducting portions 14 may be formed in any positions in the resin films 12, 13 other than the corresponding section 101a. Further, it is not necessary to form the electric conducting portion 14 to a position where the conductive pattern 121 is formed as the dummy pattern.

(Other Embodiments)

(1) In the embodiment described above, each of the first resin films 12 has the conductive pattern 121 in the in the corresponding section 101a. However, the layout of the conductive patterns 121 is not limited to the example described above.

Also, the end resin film 12a has the conductive pattern 121 only in the corresponding section 101a. However, the layout of the conductive pattern 121 of the end resin film 12a is not limited to the example described above.

The multilayer board 10 may have any other layout of the conductive patterns 121 as long as the number of the conductive patterns 121 disposed in the corresponding section 101a is greater than the number of the conductive patterns 121 disposed in the non-corresponding section 101b.

(2) In the embodiment described above, the conductive patterns 121 are formed on one side (upper surface) of the film base materials of the first resin films 12. Alternatively, the conductive patterns 121 may be formed on both sides of the film base materials of the first resin films 12.

(3) In the embodiment described above, the conductive patterns 121 are made of copper foils. However, the conductive patterns 121 may be made of any other materials, such as metal foils other than copper foils, as long as the conductive patterns 121 have electric conductivity.

(4) In the embodiment described above, the electronic component onboard substrate 1 has the protection layer 20 and the heat dissipation layer 30. However, the protection layer 20 and/or the heat dissipation layer 30 may be eliminated.

(5) In the embodiment described above, the thermosetting resin is used as the low-fluidity resin forming the first resin films 12. However, the low-fluidity resin forming the first resin films 12 is not limited to the thermosetting resin. The low-fluidity resin forming the first resin films 12 may be any other resin as long as the resin has a fluidity lower than that of the thermoplastic resin forming the second resin film 13 at the predetermined temperature. For example, the low-fluidity resin forming the first resin films 12 may be a thermoplastic resin containing an inorganic filler with an amount greater than the second resin film 13, a high melting point thermoplastic resin having a melting point (softening point) higher than that of the thermoplastic resin forming the second resin films 13, and the like.

Summarizing the above, in an embodiment, a multilayer board 10 for receiving an electronic component 2 includes a stacked body 10a and a resin base film 11. The stacked body 10a includes a plurality of thermoplastic resin films 13 and a plurality of low-fluidity resin films 12, 12a, which are alternately stacked in a stacking direction such that one of the low-fluidity resin films 12 is located at an end of the stacked body 10a as an end resin film 12a. The low-fluidity resin films 12, 12a have conductive patterns 121 on at least one surface thereof. The thermoplastic resin films 13 are softened when being heated to a predetermined temperature. The low-fluidity resin films 12, 12a have a fluidity lower than that of the thermoplastic resin films 13 at the predetermined temperature.

The resin base film 11 is adjoined to the end resin film 12a. The resin base film 11 and the stacked body 10a are integrated with each other by being hot pressed in the stacking direction. The resin base film 11 has a terminal-connecting through hole 111 for receiving an electrode terminal 2a of the electronic component 2 such that the electronic component 2 is mounted on the resin base film 11 and the electrode terminal 2a of the electronic component 2 is connected to the conductive pattern 121 of the end resin film 12a.

The stacked body 10a has an electronic component mounting section 101 provided as an area of the stacked body 10a that corresponds to the electronic component 2 with respect to the stacking direction. The electronic component mounting section 101 has a corresponding section 101a that corresponds to the terminal-connecting through hole 111 of the resin base film 11 with respect to the stacking direction and a non-corresponding section 101b without corresponding to the terminal-connecting through hole 111 of the resin base film 11 with respect to the stacking direction.

Further, the electronic component mounting section 101 is configured such that a number of the conductive patterns 121 located in the corresponding section 101a is greater than a number of the conductive patterns 121 located in the non-corresponding section 101b. Therefore, it is less likely that portions of the resin films 12, 12a, 13 corresponding to the terminal-connecting through hole 111 with respect to the stacking direction will be depressed in the stacking direction. As such, it is less likely that the depth of the terminal-connecting through hole 111 in the stacking direction will be varied. Accordingly, the reliability of connection between the electronic component 2 and the conductive pattern 121 improves.

In an embodiment, each of the low-fluidity resin films 12 has the conductive pattern 121 in the corresponding section 101a. In this case, the displacement of the conductive patterns 121 in the corresponding section 101a is effectively reduced. Accordingly, the reliability of connection between the electronic component 2 and the conductive pattern 121 further improves.

In an embodiment, the end resin film 12a has the conductive pattern 121 only in the corresponding section 101a. In this case, it is less likely that a portion of the end resin film 12a in the non-corresponding section 101b will be deformed toward the electronic component 2. Accordingly, the reliability of connection between the electronic component 2 and the conductive pattern 121 further improves.

While only the selected exemplary embodiments and modifications thereof have been chosen to illustrate the present disclosure, it will be apparent to those skilled in the art from this disclosure that various changes and further modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A multilayer board for receiving an electronic component, the multilayer board comprising:
a stacked body including a plurality of thermoplastic resin films and a plurality of low-fluidity resin films, which are alternately stacked in a stacking direction, one of the plurality of low-fluidity resin films being located at an end of the stacked body as an end resin film, each of the plurality of low-fluidity resin films having a conductive pattern on at least one surface thereof, the plurality of thermoplastic resin films being softened when being heated to a predetermined temperature, the plurality of low-fluidity resin films having a fluidity lower than that of the thermoplastic resin films at the predetermined temperature; and
a resin base film adjoined to the end resin film, the resin base film and the stacked body being integrated with each other by being hot pressed in the stacking direction, wherein
the resin base film includes a terminal-connecting through hole configured to receive an electrode terminal of the electronic component mounted on the resin base film and the electrode terminal of the electronic component is inserted into the terminal-connecting through hole and connected to the conductive pattern of the end resin film,
the stacked body has an electronic component mounting section provided as an area of the stacked body that corresponds to the electronic component with respect to the stacking direction, the electronic component mounting section has a corresponding section that corresponds to the terminal-connecting through hole of the resin base film with respect to the stacking direction and a non-corresponding section without corresponding to the terminal-connecting through hole of the resin base film with respect to the stacking direction, and
the electronic component mounting section includes a number of layers of the conductive patterns located in the corresponding section with respect to the stacking direction is greater than a number of layers of the conductive patterns located in the non-corresponding section with respect to the stacking direction.

2. The multilayer board according to claim 1, wherein each of the plurality of low-fluidity resin films has the conductive pattern in the corresponding section.

3. The multilayer board according to claim 1, wherein the end resin film has the conductive pattern only in the corresponding section.

4. The multilayer board according to claim 2, wherein the end resin film has the conductive pattern only in the corresponding section.

* * * * *